(12) United States Patent
Yang et al.

(10) Patent No.: US 6,530,992 B1
(45) Date of Patent: Mar. 11, 2003

(54) METHOD OF FORMING A FILM IN A CHAMBER AND POSITIONING A SUBSTITUTE IN A CHAMBER

(75) Inventors: Michael X. Yang, Fremont, CA (US); Henry Ho, San Jose, CA (US); Steven A. Chen, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/350,632

(22) Filed: Jul. 9, 1999

(51) Int. Cl.$^7$ .............................................. C23C 16/00
(52) U.S. Cl. ..................... 118/695; 118/697; 118/704; 118/715; 118/725; 118/728; 438/791; 700/121
(58) Field of Search ................................ 118/725, 728, 118/715, 695, 697, 704; 700/95, 121; 438/791

(56) References Cited

U.S. PATENT DOCUMENTS

| 5,268,200 A | 12/1993 | Steger |
| 5,399,387 A | 3/1995 | Law et al. |
| 5,589,233 A | 12/1996 | Law et al. |
| 5,629,043 A | 5/1997 | Inaba et al. |
| 5,851,298 A | * 12/1998 | Ishii ........................... 118/728 |
| 5,871,805 A | * 2/1999 | Lemelson ...................... 427/8 |
| 5,895,530 A | 4/1999 | Shrotriya et al. |
| 5,935,334 A | * 8/1999 | Fong .......................... 118/725 |
| 5,976,900 A | * 11/1999 | Qiao et al. ..................... 438/14 |
| 6,297,173 B1 | * 10/2001 | Tobin ........................ 438/791 |

FOREIGN PATENT DOCUMENTS

| JP | 62012136 | 1/1987 |
| KR | 98042359 | * 8/1998 |

OTHER PUBLICATIONS

Sherman, Chemical Vapor Deposition for Microelectronics, Principles, Technology and Applications, Noyes Publications, p. 77, 1987.*

* cited by examiner

*Primary Examiner*—Richard Bueker
(74) *Attorney, Agent, or Firm*—Blakely Sokoloff Taylor & Zafman

(57) ABSTRACT

Methods and apparatuses of forming a film on a substrate including introducing a pretreatment material into a processing chamber sufficient to form a film as a portion of an inner surface of the processing chamber to inhibit outgassing from that portion of the chamber, introducing a substrate into the chamber, and forming a film on the substrate.

6 Claims, 4 Drawing Sheets

METHOD OF FORMING A FILM IN A CHAMBER AND POSITIONING A SUBSTITUTE IN A CHAMBER

BACKGROUND OF THE INVENTION

1. Field of the Invention

This invention relates generally to deposition technologies in integrated circuit chip processing and more particularly to the deposition of silicon nitride films.

2. Discussion of Related Art

The manufacture of integrated circuits generally involves the formation of a plurality of layers of material on a semiconductor (e.g., silicon) wafer in a processing chamber, each layer serving a specific function generally related to the routing and isolation of specific signals. Temperatures in a processing chamber during these formation processes may reach 800° C. to 850° C. Such temperatures tend to cause outgassing of metals from the chamber into or on a semiconductor wafer. Metal contamination of a semiconductor wafer is undesirable because it increases the risk of failure of the integrated circuit devices formed from the wafer.

It is desirable to provide a method that reduces or prevents outgassing of metals from the chamber to a semiconductor wafer.

SUMMARY OF THE INVENTION

Methods and apparatuses of forming a film on a substrate are disclosed. In one embodiment of the invention, a pre-treatment material is introduced into a processing chamber sufficient to form a film on a portion of an inner surface of the processing chamber. The pre-treatment film inhibits contaminants such as outgassing materials from the chamber walls. A substrate is introduced into the processing chamber after the pre-treatment processing and a film is formed on a surface of the substrate.

Another embodiment of the invention relates to using a wafer lifting tube, comprised representatively of aluminum nitride, that is mounted on a heater lift mechanism by a spring loaded force to reduce thermal stress. Another embodiment of the invention involves having a wafer lifting tube comprised of a single integral piece. Other aspects and methods of the invention as well as apparatuses formed using these methods are described further below in conjunction with the following figures.

BRIEF DESCRIPTION OF THE DRAWINGS

The invention is further described by way of example with reference to the accompanying drawings wherein.

DETAILED DESCRIPTION

In the following description, for purposes of explanation, numerous specific details are set forth in order to provide a thorough understanding of the present invention. It will be evident, however, to one skilled in the art that the present invention may be practiced without these specific details. In certain instances specific apparatus, structures, and methods have not been described so as not to obscure the present invention.

Methods and apparatuses of forming a silicon nitride layer in a processing chamber are disclosed. In one embodiment of the invention, a method and system is described of pre-treating a processing chamber to inhibit contamination of a wafer film process in the chamber. Another embodiment of the invention relates to using a wafer lifting tube, comprising, for example, aluminum nitride, that is mounted on a heater lift mechanism by a spring loaded force to reduce thermal stress. Another embodiment of the invention involves having a wafer lifting tube comprised of a single integral piece.

In one embodiment, the film or layer of silicon nitride ($Si_3N_4$) is formed in a single wafer processing chamber that is heated by using radiant or resistive heat. A mixture of gases, including a nitrogen source gas, a silicon source gas, and a carrier gas, are introduced into the chamber to form the $Si_3N_4$ film or layer. The inside of the chamber is exposed to the mixture at a temperature of between 600° C. and 800° C. To form a suitable $Si_3N_4$ film or layer, the pressure in the processing chamber is maintained approximately in the range of 1–500 Torr. A suitable mid-level pressure range is 100–300 Torr. A silicon source gas and a nitrogen source gas are introduced into the chamber to form the $Si_3N_4$ layer or film. In one embodiment, the partial pressure of the silicon source gas such as silane is approximately in the range of 0.05 to 5 Torr and the nitrogen source gas such as ammonia has a partial pressure equal to or less than 300 Torr in the chamber. Other partial pressures may be used for the silicon and nitrogen source gases depending, in part, upon the particular gas used and the reaction temperature.

Figure 1:
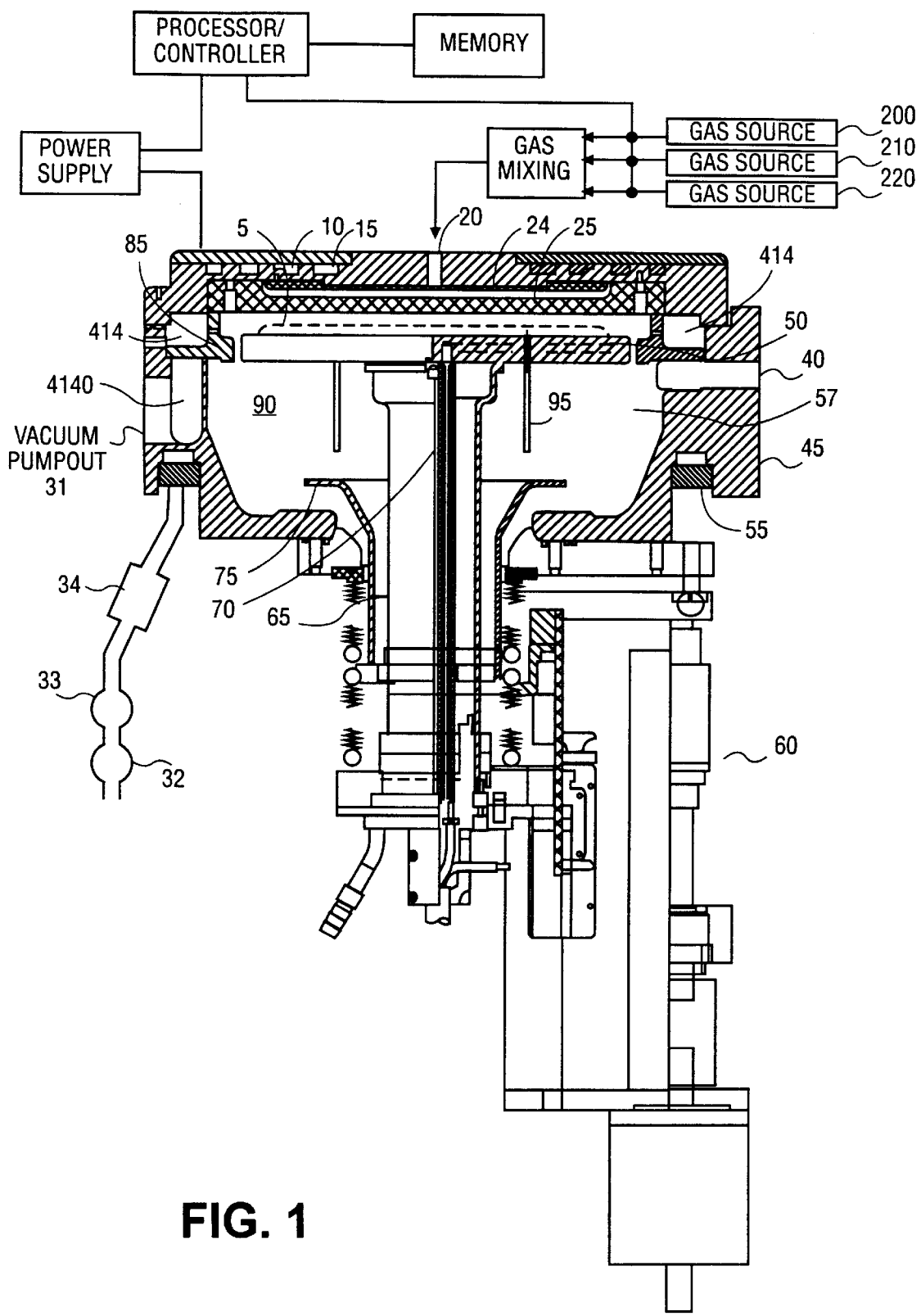
FIG. 1 illustrates the inside of a processing chamber used to form silicon nitride on a substrate.
Figure 2:
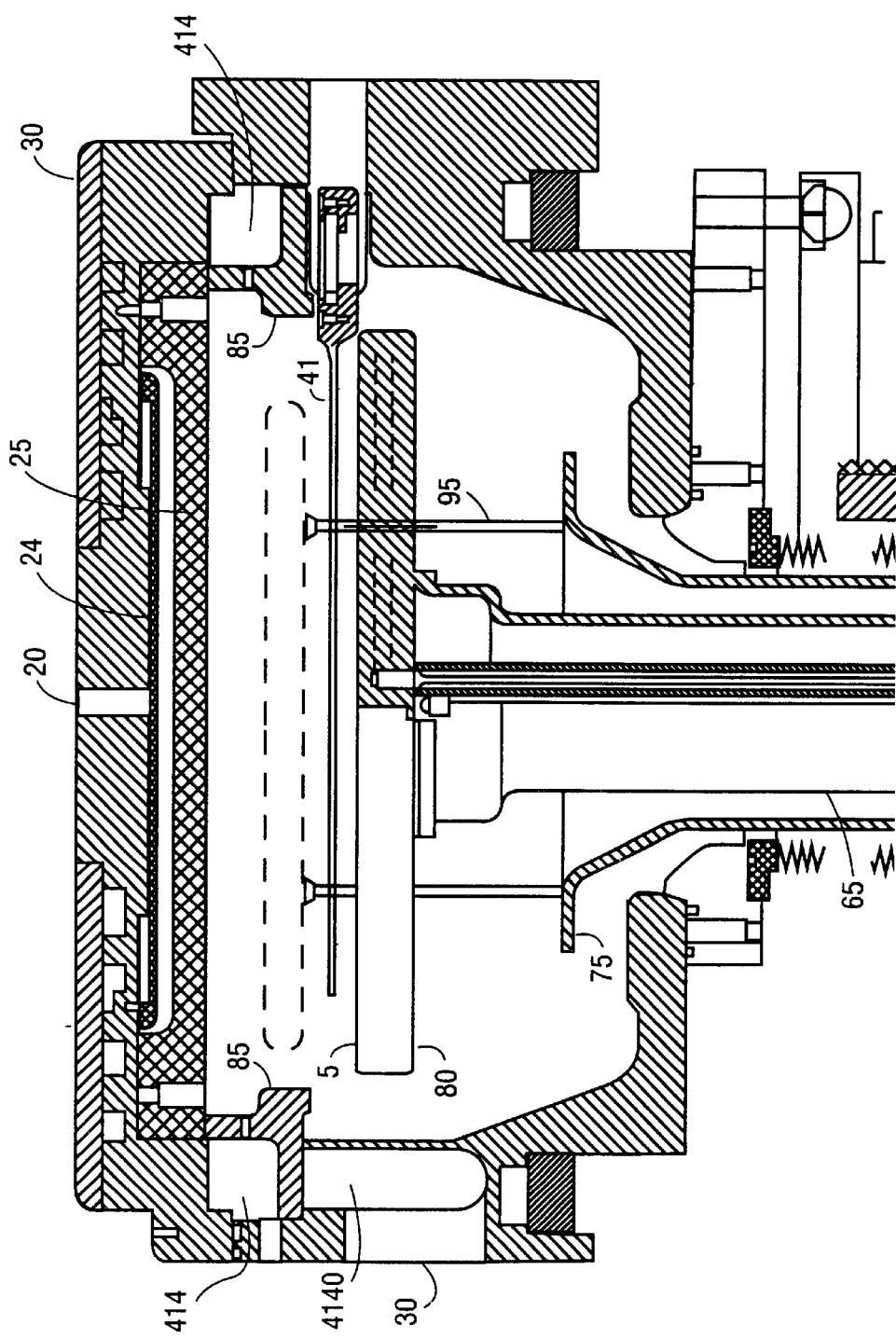
FIG. 2 illustrates the inside of a processing chamber used to form silicon nitride on a substrate in which the wafer is in a wafer-separate position.
Figure 3:
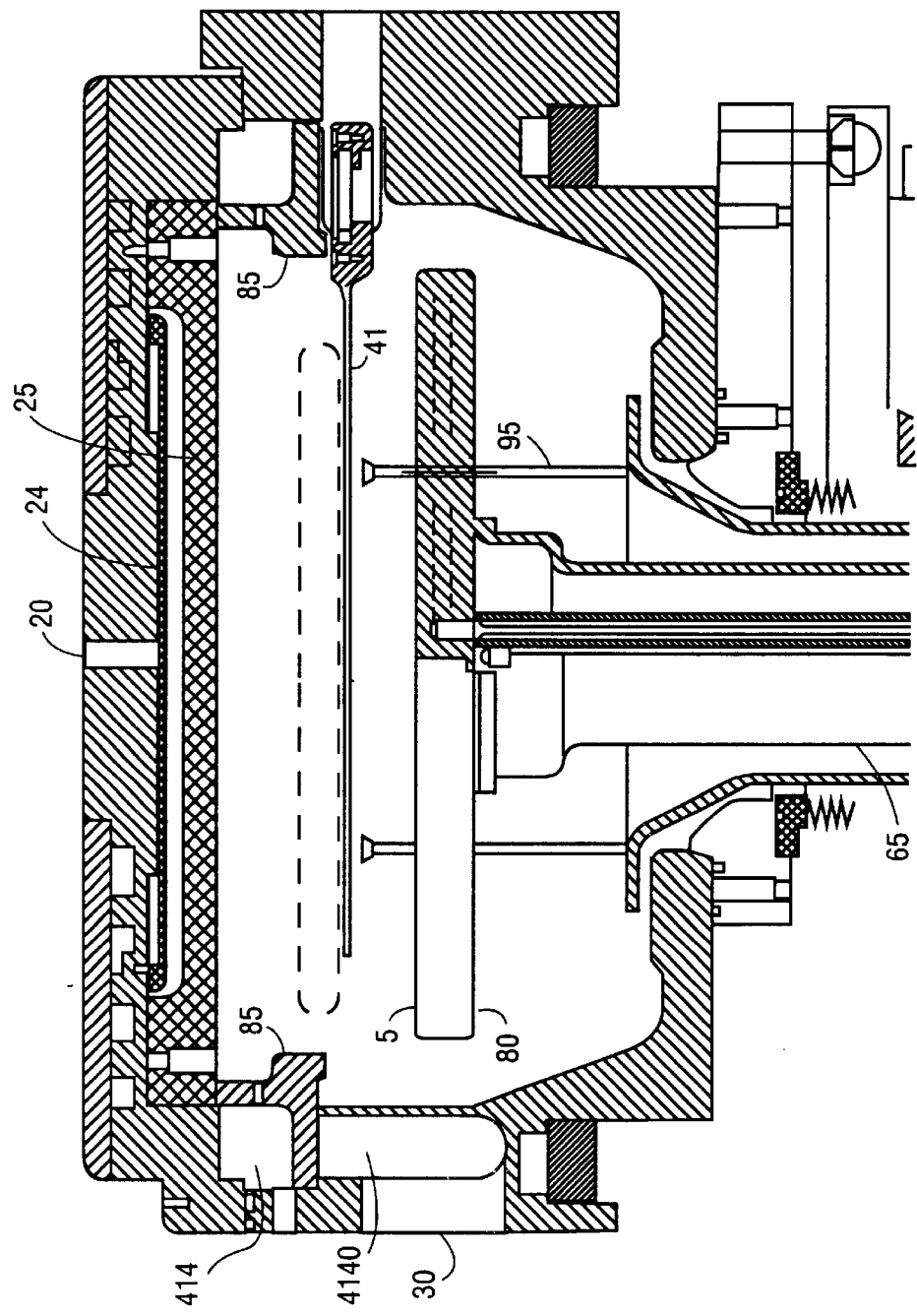
FIG. 3 shows the same cross-sectional view as in FIG. 2 in the wafer-load position.

FIGS. 1–3 describe a resistively-heated processing chamber. Although the invention is described relative to a resistively-heated processing chamber (FIGS. 1 through 3), it is to be appreciated that other types of processing chambers may be used in conjunction with the techniques described herein.

FIGS. 1–3 illustrate, for example, a chamber suitable for a low pressure chemical vapor deposition (LPCVD) process. The chamber is constructed of materials such that a pressure of greater than or equal to 100 Torr can be maintained. For the purpose of illustration, a chamber of approximately in the range of eight liters is used. FIG. 1 illustrates the inside of process chamber body 45 in a "wafer-process" position. FIG. 2 shows the same view of the chamber in a "wafer-separate" position. FIG. 3 shows the same cross-sectional side view of the chamber in a "wafer-load" position. In each case, a wafer is indicated in dashed lines to indicate its location in the chamber.

FIGS. 1–3 show chamber body 45 that defines reaction chamber 90 in which the reaction between a process gas or gases and the wafer takes place (e.g., a CVD reaction). Chamber body 45 is constructed, in one embodiment, of aluminum and has passages 55 for water to be pumped therethrough to cool chamber body 45 (e.g., a "cold-wall" reaction chamber). Resident in chamber 90 is resistive heater 80 including, in this view, susceptor 5 supported by shaft 65. Susceptor 5 has a surface area sufficient to support a substrate such as a semiconductor wafer (shown in dashed lines).

Process gas enters otherwise sealed chamber 90 through gas distribution port 20 in a top surface of chamber lid 30 of chamber body 45. The process gas then goes through a plurality of holes in blocker plate 24. Thereafter, the process gas is distributed throughout chamber 90 by perforated face plate 25 located, in this view, above resistive heater 80 and coupled to chamber lid 30 inside chamber 90.

A wafer is placed in chamber 90 on susceptor 5 through entry port 40 in a side portion of chamber body 45. To accommodate a wafer for processing, heater 80 is lowered so that the surface of susceptor 5 is below entry port 40 as shown in FIG. 3. Typically by a robotic transfer mechanism, a wafer is loaded by way of, for example, a transfer blade into chamber 90 onto the superior surface of susceptor 5. Once loaded, entry port 40 is sealed and heater 80 is advanced in a superior (e.g., upward) direction toward face plate 25 by lifter assembly 60 that is, for example, a step motor. The advancement stops when the wafer is a short distance (e.g., 400–700 mils) from face plate 25 (see FIG. 1). In the wafer-process position, chamber 90 is effectively divided into two zones, a first zone above the superior surface of susceptor 5 and a second zone below the inferior surface of susceptor 5. At this point, process gases controlled by a gas panel flow into the chamber 90 through gas distribution port 20, through blocker plate 24 and perforated face plate 25, and typically react or are deposited on a wafer to form a film. A purge gas such as nitrogen will typically be introduced into the second zone of the chamber to minimize leakage of the process gas and the formation of film in the second zone (i.e., the portion of the chamber below the susceptor).

In a pressure controlled system, the pressure in chamber 90 is established and maintained by a pressure regulator or regulators coupled to chamber 90. In one embodiment, for example, the pressure is established and maintained by baretone pressure regulator(s) coupled to chamber body 45 as known in the art. In this embodiment, the baretone pressure regulator(s) maintains pressure at a level of equal to or greater than 100 Torr.

Residual process gas or gases are pumped from chamber 90 through pumping plate 85 to a collection vessel. Pumping plate 85 may be used to create a uniform flow pattern in the chamber. Pumping plate 85 causes gas to flow uniformly in a radial direction through the chamber resulting in a gas flow pattern that creates a uniform $Si_3N_4$ layer on a substrate.

After processing, chamber 90 may be purged, for example, with an inert gas, such as nitrogen.

After processing and purging, heater 80 is advanced in an inferior direction (e.g., lowered) by lifter assembly 60 to the position shown in FIG. 2. As heater 80 is moved, lift pins 95, having an end extending through openings or throughbores in a surface of susceptor 5 and a second end extending in a cantilevered fashion from an inferior (e.g., lower) surface of susceptor 5, contact lift plate 75 positioned at the base of chamber 90. As is illustrated in FIG. 2, in one embodiment, at this point, lift plate 75 does not advance from a wafer-load position to a wafer-separate position as does heater 80. Instead, lift plate 75 remains at a reference level, $H_1$, indicated in FIG. 2 on shaft 65. As heater 80 continues to move in an inferior direction through the action of lifter assembly 60, lift pins 95 remain stationary and ultimately extend above the superior or top surface of susceptor 5 to separate a processed wafer from the surface of susceptor 5.

Once a processed wafer is separated from the surface of susceptor 5, a transfer blade of a robotic mechanism is inserted through opening 40 to a "pick out" position inside chamber 90. The "pick out" position is below the processed wafer. Next, lifter assembly 60 inferiorly moves (e.g., lowers) wafer lift tube 75 to, for example, a second reference level, $H_2$, indicated in FIG. 3 on shaft 65. By moving wafer lift tube 75 in an inferior direction, lift pins 95 are also moved in an inferior direction, until the surface of the processed wafer contacts the transfer blade. The processed wafer is then removed through entry port 40 by, for example, a robotic transfer mechanism that removes the wafer and transfers the wafer to the next processing step. A second wafer may then be loaded into chamber 90. The steps described above are reversed to bring the wafer into a process position. A detailed description of one suitable lifter assembly 60 is described in U.S. Pat. No. 5,772,773, assigned to Applied Materials, Inc., of Santa Clara, Calif.

In a high temperature operation, such as LPCVD processing of $Si_3N_4$, the reaction temperature inside chamber 90 can be as high as 750° C. or more. Accordingly, the exposed components in chamber 90 must be compatible with such high temperature processing. Such materials should also be compatible with the process gases and other chemicals, such as cleaning chemicals (e.g., $NF_3$) that may be introduced into chamber 90. Exposed surfaces of heater 80 may be comprised of a variety of materials provided that the materials are compatible with the process. For example, susceptor 5 and shaft 65 of heater 80 may be comprised of similar aluminum nitride material. Alternatively, the surface of susceptor 5 may be comprised of high thermally conductive aluminum nitride material (on the order of 95% purity with a thermal conductivity from 140 W/mK to 200 W/mK) while shaft 65 is comprised of a lower thermally conductive aluminum nitride. Susceptor 5 of heater 80 is typically bonded to shaft 65 through diffusion bonding or brazing as such coupling will similarly withstand the environment of chamber 90.

FIG. 1 also shows a cross-section of a portion of heater 80, including a cross-section of the body of susceptor 5 and a cross-section of shaft 65. In this illustration, FIG. 1 shows the body of susceptor 5 having two heating elements formed therein, first heating element 50 and second heating element 57. Each heating element (e.g., heating element 50 and heating element 57) is made of a material with thermal expansion properties similar to the material of the susceptor. A suitable material includes molybdenum (Mo). Each heating element includes a thin layer of molybdenum material in a coiled configuration.

In FIG. 1, second heating element 57 is formed in a plane of the body of susceptor 5 that is located inferior (relative to the surface of susceptor 5 in the figure) to first heating element 50. First heating element 50 and second heating element 57 are separately coupled to power terminals. The power terminals extend in an inferior direction as conductive leads through a longitudinally extending opening through shaft 65 to a power source that supplies the requisite energy to heat the surface of susceptor 5. Extending through openings in chamber lid are two pyrometers, first pyrometer 10 and second pyrometer 15. Each pyrometer provides data about the temperature at the surface of susceptor 5 (or at the surface of a wafer on susceptor 5). Also of note in the cross-section of heater 80 as shown in FIG. 1 is the presence of thermocouple 70. Thermocouple 70 extends through the longitudinally extending opening through shaft 65 to a point just below the superior or top surface of susceptor 5.

In accordance with one embodiment of the invention, the gases include a carrier gas 200, a nitrogen source gas 220, and a silicon source gas 210. Suitable carrier gas sources include, but are not limited to, hydrogen ($H_2$), nitrogen ($N_2$), argon (Ar), and helium (He). Suitable nitrogen source gas includes, but is not limited to, ammonia ($NH_3$). A suitable silicon source gas includes, but is not limited to, silane, dichlorosilane, and disilene. The nitrogen source gas and the silicon source gas combine to produce a $Si_3N_4$ layer on the wafer.

In use, silicon source gas 210 may be mixed with carrier gas 200 before or during introduction into the processing chamber 90. The mixture of the carrier gas and the silicon source gas is then introduced into gas inlet 20 of chamber 90. Nitrogen source gas 220 is also introduced into gas inlet 20 and allowed to mix with the mixture of the carrier gas and the silicon source gas. The process gas passes through the plurality of holes in a blocker plate 24 and then through the plurality of holes in the face plate 25. These gases then flow into the chamber 90 wherein the gases are exposed to the inside portion of chamber 90. Thereafter, the process gas exits through pumping plate 85 into the pumping channel 414.

The flow rate of the gases is dependent upon the size of semiconductor processing chamber 90. In one embodiment, the total flow rate of the gases ranges from five to fifteen liters per minute based upon a total effective volume of a processing chamber of one to nine liters. The ratio of at least one of the gases or the total gas flow rate relative to the chamber is 0.50 to 8 liters per minute per liter of chamber volume.

Exposure of the inside of chamber 90 to the mixture of gases causes deposition of a silicon nitride ($Si_3N_4$) layer inside of chamber 90 according to thermal chemical vapor deposition principles. Exposure of the gases to the inside of chamber 90 at an elevated temperature causes dissociation of the molecules of the silicon source gas and the nitrogen source gas into smaller molecules. The smaller molecules then recombine with one another. Provided below is a general chemical reaction that occurs in this process. Silane generally reacts with ammonia according to the chemical equation:

$$3SiH_4 + 4NH_3 \rightarrow Si_3N_4 + 12H_2$$

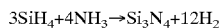

As a general rule, the higher the temperature in chamber 90, and therefore of the inside of chamber 90, the quicker the silicon nitride layer will form.

In one embodiment, silane ($SiH_4$), ammonia ($NH_3$), and nitrogen ($N_2$) are introduced with 100 standard cubic centimeters per minute (sccm) of $SiH_4$, 5 standard liters per minute (slm) of $NH_3$, and 10 slm of $N_2$, while the inside of chamber 90 is heated to a temperature of between 600° C. and 800° C. During deposition, pressure in the chamber of between 100 to 500 Torr is maintained. A suitable mid-level pressure range is 100–300 Torr. In one embodiment, the partial pressure of silane is approximately in the range of 0.05 to 5 Torr and ammonia has a partial pressure equal to or less than 300 Torr in chamber. However, other partial pressures may be used for the silicon and nitrogen source gases which may depend upon the particular gas used.

In another embodiment, gases may be used in the following proportions: $SiH_4$: 70 sccm, $NH_3$: 2 slm, and $N_2$: 8 slm. In yet another embodiment, gases may be used in the following proportions: dichlorosilane: 230 sccm, $NH_3$: 1,000 sccm, and $H_2$: 9,000 sccm. If $N_2$ is used as a carrier gas, a deposition rate of about 50 to 5,000 Å per minute may be achieved at a temperature as low as 600° C.

The above embodiment described controlling conditions in a reaction chamber to form a $Si_3N_4$ film on a wafer. It is to be appreciated that such control may be done manually or with the aid of a system controller. In the former instance, an operator may monitor and adjust the power supply to the heater to control the temperature, and a vacuum source to control the pressures. The operator may also manually adjust valves associated with the individual gases to regulate the mixture and flow rate of the gases.

A system controller may also be employed to handle the control tasks associated with system control. FIG. 1 illustrates a system controller or processor coupled to a power supply and a gas manifold. The controller may be configured to record the temperature measured by the temperature indicators and control the power supplied to the heating elements based, for example, on an algorithm that determines a relative value of the temperature difference and adjusts the heating elements accordingly. The controller may also be configured to control the mixture and flow of gases to the processing chamber. In an LPCVD reaction process, the controller may further be coupled to a pressure indicator that measures the pressure in the chamber as well as a vacuum source to adjust the pressure in the chamber.

The system controller is supplied with control signal generation logic. The controller may also be coupled to a user interface that allows an operator to enter the reaction parameters, such as the desired reaction temperature, the acceptable tolerance of a temperature difference between indicators (e.g., ±3° C.), the reaction pressure, and the flow of gases to the processing chamber.

Control signal generation logic is supplied to the system controller in the form of, for example, software instruction logic that is a computer program stored in a computer-readable medium such as the memory of the controller. The computer program includes sets of instructions that dictate the timing, mixture of gases, chamber pressure, chamber temperature, and other parameters of a particular process. It is to be appreciated that other computer programs such as one stored on another memory device, including but not limited to, a floppy disk, may also be used to operate the system, controller.

The computer program code can be written in a computer-readable programming language such as, for example, 68000 assembly language, C, C++, Pascal, Fortran or others. Suitable program code is generally entered into a single file or multiple files using a text editor. If the entered code text is in a high level language, the code is compiled, and the resultant compiler code is then linked with an object code or precompiled object code, the system invokes the object ode, causing the computer system to load the code in memory, from which the central processing unit reads and executes the code to perform the task identified in the program.

In one aspect, the invention contemplates a pre-treatment or pre-coat of a portion of the processing chamber prior to introduction of the wafer for processing. In particular, the invention contemplates coating the process portions/components of the chamber that may produce contaminants during film formation, particularly those portions/components that may produce contaminants when heated. The pretreatment film should be capable of masking diffusion (e.g., outgassing) of contaminants from the inner chamber walls (e.g., aluminum, copper, chromium, sodium, etc.) and the susceptor, and should also be compatible with the film process contemplated for the wafer (e.g., $SiO_2$, $Si_3N_4$, or polysilicon). By coating the walls of the processing chamber, contaminants from the chamber cannot escape and contaminate the wafer. Contamination may occur, for example, by outgassing from the chamber walls (e.g., aluminum alloy walls) or from the susceptor. A ceramic aluminum nitride susceptor, for example, will generally contain some potential constituents, e.g., aluminum, that may contaminate a wafer. In a resistive heater such as described above, the surface of the susceptor is generally at a higher temperature than other parts of the chamber (e.g, chamber walls). The increased temperature contributes to potential contamination from the susceptor. The pre-treatment or pre-coat described herein inhibits such contamination.

For a $Si_3N_4$ film process, any material that will coat the processing chamber including the surface of the susceptor is suitable. $Si_3N_4$ or $SiO_2$ are representative of suitable materials as the pre-coat material for a $Si_3N_4$ film process. $Si_3N_4$ is preferred in this embodiment, since the film process will utilize the same materials that make up the pre-coat. In one embodiment of a process of forming a film on a wafer, the pre-coat layer is deposited to a thickness suitable to minimize diffusion of contaminants. For a $Si_3N_4$ pre-coat layer, the process chamber reaction conditions (e.g., mixture of gases, temperature, pressure) are prescribed as described above, the resistive heater is in a wafer process position, and sufficient source gases are introduced to form a film or layer on the walls of the chamber (particularly in the first zone, i.e., the film forming zone) and on susceptor 5 having a thickness of, for example, 100 Å or more, and preferably 500 Å or more. A timed process may be utilized to deliver the desired thickness. Purge gas into the second zone (i.e., the lower portion of the chamber) may be reduced to allow film formation on components of the chamber in that zone that may produce contaminants when heated. The film thickness may be observed on the surface of susceptor 5.

Once a suitable pre-coat layer is deposited, a wafer is introduced onto the chamber and the process proceeds such as described above to form a suitable $Si_3N_4$ film on the wafer. A series of wafers may be processed with the same pre-coat serving to inhibit the introduction of contaminants onto the wafer. The pre-treatment or pre-coat may be controlled either manually or with the aid of a controller or processor. In the latter situation, a controller may contain instruction logic that directs the pre-treatment of the chamber prior to the introduction and processing of a wafer.

Table I shows examples of contamination that may occur to a semiconductor wafer. Table I provides three examples where contamination was measured on a wafer by a conventional inductive-coupled-plasma (ICP)-mass spectrometry (MS) contamination test. In each example, a wafer was deposited with 1000 Å film of $Si_3N_4$ in a resistively-heated chamber such as described above. Example 1 shows the amount of contamination that results when there is no precoating of the inside of a processing chamber. In this example, the amount of aluminum contamination of the film is measured at approximately $32 \times 10^{10}$ atoms/cm². Measurable amounts of calcium, copper, nickel, and sodium are also detected.

Example 2 and example 3 show a precoat to the inside of a processing chamber according to the invention. Example 2 illustrates a situation where the chamber has not been pre-cleaned. Example 3 illustrates a situation where the chamber was subjected to a plasma clean prior to the pre-coat treatment. Contaminants from prior cleaning treatments have been known to contaminate wafers during processing steps. As reflected here, both examples 2 and 3 show a significant decrease in metal contamination in the film. In summary, Table I shows that precoating the processing chamber significantly decreases contamination in a film on a wafer even where the film formation follows a cleaning step.

TABLE I

| ICP-MS Metal Contamination Test | | | |
|---|---|---|---|
| Example | 1 | 2 | 3 |
| Heater Temperature (° C.) | 750 | 750 | 750 |
| Film thickness | 1000 Å | 1000 Å | 1000 Å |
| Plasma clean | No | No | ICP |
| Precoat the inside of a processing chamber | No | Yes | Yes |
| Contaminant | Contamination/Surface Area on wafer ($\times 10^{10}$ cm$^{-2}$) | | |
| Al | 32 | <0.5 | 3.2 |
| Ca | 4.3 | 1.9 | 1.7 |
| Cr | <0.1 | <0.1 | <0.1 |
| Cu | 9.3 | 0.41 | 1.4 |
| Fe | <0.3 | <0.3 | <0.3 |
| Ni | 1.1 | <0.05 | 0.22 |
| K | 0.6 | <0.5 | <0.5 |
| Na | 3.7 | 0.52 | <0.5 |
| Zn | 0.77 | <0.1 | 0.12 |

It is to be appreciated that the pre-treatment of a chamber to reduce contamination during processing is not limited to $Si_3N_4$ film processing or use with resistively-heated processing chambers such as described above. Instead, the invention finds use in many other environments where wafer (or other substrate) contamination reduction is desirable. For example, the pre-treatment of a processing chamber is suitable with other film processing objectives, including other silicon-based films such as $SiO_2$ and polysilicon. The pre-treatment is also compatible with other chambers, including, but not limited to, radiantly-heated CVD processing chambers where, for example, a susceptor or other wafer-supporting device may outgas contaminants and potentially contaminate a wafer or film on a wafer. A pre-treatment to mask this component of a radiantly-heated chamber will reduce potential contaminants.

Referring to FIGS. 1–3, there was described lift pins 95 through openings or throughbores in a susceptor 5. Lift pins 95 serve, in one manner, to separate the wafer from the surface of susceptor 5 to allow a transfer blade access to the wafer. Lift pins 95 separate the wafer from the surface of susceptor 5 by contacting lift plate 75 (FIG. 2). Lift plate 75 represents the surface of a wafer lifting tube coupled to lifter assembly 60 and surrounding shaft 65 of heater 80.

Figure 4:
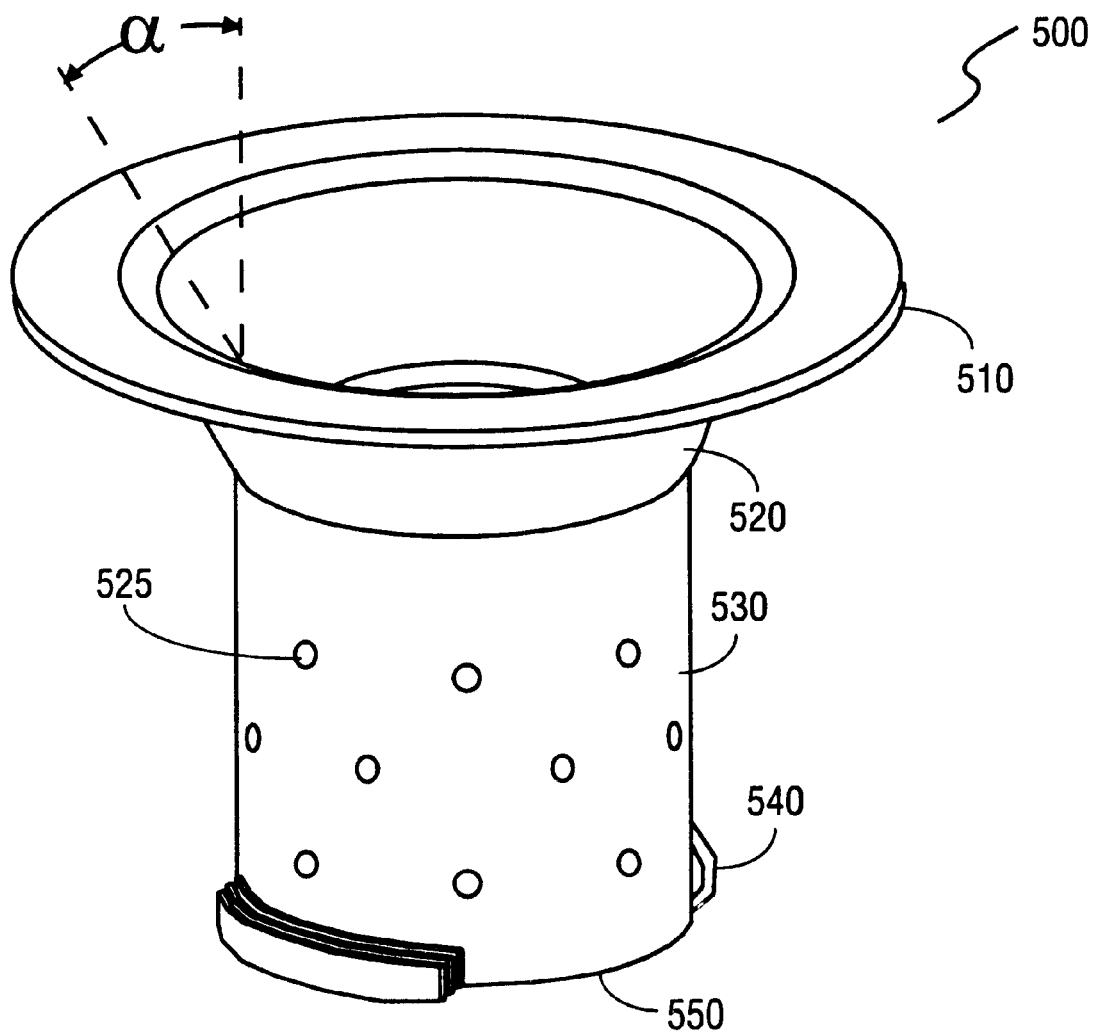
FIG. 4 is a perspective view of the wafer lifting tube.

FIG. 4 is a perspective view of a wafer lifting tube according to the invention. In one embodiment, wafer lifting tube 500 is comprised of a single integral piece rather than the multiple pieces that embody the lifting tubes in the prior art.

In one embodiment, wafer lifting tube 500 comprises circular lift plate 510, funnel portion 520 and body member 530 formed as an integral unit. Wafer lifting tube 500 comprises a material that is resistant to the reaction conditions of the processing chamber. In the example of a LPCVD reaction chamber where temperatures may reach 800° C. or more, one suitable material for wafer lifting tube 500 that will withstand such temperatures as well as process gases/reactants of an LPCVD process is aluminum nitride. The material selected for wafer lifting tube 500 should also be resistant to thermal expansion under reaction conditions. Aluminum nitride is one such material that experiences minimal thermal expansion at such temperatures. Aluminum nitride is also generally resistant to chemicals used to clean a processing chamber, such as $NF_3$ to clean an LPCVD chamber.

Body member 530 of wafer lifting tube 500 is adapted to surround shaft 65 of heater 80. Accordingly, body member 530 has a longitudinal opening through its length with a diameter greater than the outside diameter of shaft 65. In one example, body member 530 has an inner diameter of approximately 3.202 inches sized to fit around shaft 65 having a diameter less than three inches. In this example, body member 530 has an outer diameter of approximately 3.490 inches. Body member 530 also has a plurality of holes or openings 525 throughout its body portion. Openings 525 permit gas to flow through body member 530. In one example, a bottom purge gas of for example nitrogen is introduced into the lower portion of the processing chamber (i.e., the second zone) as part of a process recipe. This purge gas serves as a clean gas to inhibit build up of process material (e.g., film) in the lower portion of the chamber. Openings 525 permit the purge gas to get within wafer lifting tube 500 and, in one sense, inhibit build-up of materials between wafer lifting tube 500 and shaft 65.

Lift plate 510 serves in one aspect to contact lift pins 95 and separate a wafer from the surface of stage 85 of heater 80. Thus lift plate 510 must encompass a diameter suitable to contact lift pins 95. Lift plate 510, in one embodiment, has a relatively small thickness on the order of 0.12 inches.

As can be seen in FIGS. 1–3, the apex of shaft 65 of heater 80 comprises a lip portion having a larger outside diameter than the remaining portion of shaft 65. Accordingly, in one embodiment, wafer lifting tube 500 is adapted such that lift plate 510 may extend past the lip portion of shaft 65 and approach the underside of stage 85. Wafer lifting tube 500 includes funnel portion 520 providing a longitudinally extending opening through a portion of wafer lifting tube 500 with an inside diameter that is large enough to accommodate the lip portion of shaft 65. Exemplary dimensions of funnel portion 520 include an inner diameter of approximately 3.202–6.250 inches and an outer diameter of 3.490–6.30 inches. Funnel portion 65 also serves to support relatively thin lift plate 510. In one embodiment, funnel portion 65 extends from body member 530 at an angle of approximately 60°.

Two diametrically opposed flange portions 540 extend about 45° around the base of cylindrical portion 530. Flange portions 540 couple to lifter assembly 60 to actuate wafer lifting tube 500. Portion 540 is spring-loadedly mounted into a mating spring on lifter assembly 60 to hold wafer lifting tube in a desired position. The spring-loaded coupling allows the coupling to withstand high temperature operation without breaking or distortion of the coupling due, for example, to the thermal expansion of materials.

Although the present invention has been described with respect to certain types of substrate processing chamber, variations in equipment and design can be made by one skilled in the art and are meant to be included herein. The invention is only to be limited by the scope of the appended claims.

What is claimed:

1. A system for generating a first silicon nitride film on at least a portion of an inner surface of a chamber and a second silicon nitride film on a substrate, comprising:

the chamber configured to house the substrate for processing;

at least one pre-treatment source gas for generating the first silicon nitride film in the chamber;

at least one source gas for generating a film on a substrate;

a system controller configured to control the introduction from the at least one source gas into the chamber; and a memory coupled to the controller comprising a computer-readable medium having a computer-readable program embodied therein for directing operation of the system, the computer-readable program comprising:

instructions for controlling a gas delivery system prior to the introduction of the substrate, to introduce the at least one pre-treatment source gas into the chamber in an amount sufficient to form the first silicon nitride film of about 50 to 5000 Å per minute by thermal chemical vapor deposition to inhibit outgassing from chamber components;

instructions for controlling a temperature from about 600° C. to about 800° C. and a pressure from about 100 Torr to about 500 Torr; and instructions for controlling the gas delivery system to introduce the at least one source gas into the chamber to form a film on the surface of a substrate introduced into the chamber by thermal chemical vapor deposition.

2. The system of claim 1, wherein the at least one pre-treatment source gas and the at least one source gas for generating a film on the substrate comprise the same constituents.

3. The system of claim 2, wherein the chamber components comprise the chamber walls and a heater in the chamber.

4. The system of claim 2, wherein the chamber walls comprise an aluminum material and the heater comprises aluminum nitride, the instructions for introducing the at least one pre-treatment source gas comprising forming a film on a portion of the heater.

5. A computer readable storage medium containing executable computer program instructions which when executed cause a digital processing system to perform a method comprising:

introducing a pre-treatment material into a processing chamber in a predetermined amount sufficient to form a first silicon nitride film at a rate of about 50 to 5000 Å per minute that inhibits outgassing prior to the introduction of a substrate into the processing chamber;

introducing a substrate into the processing chamber;

forming a second silicon nitride film on the surface of the substrate;

wherein reaction parameters to introduce a pre-treatment material and form the first silicon nitride film and the second silicon nitride film on the substrate comprise:

maintaining a pressure from about 100 Torr to about 500 Torr and a temperature from about 600° C. to about 800° C.;

providing a gas mixture comprising a silicon source gas and a nitrogen source gas into the chamber to form a first silicon nitride film and the second silicon nitride film by thermal chemical vapor deposition.

6. The storage medium of claim 5, wherein the introducing a pre-treatment material and forming a film on a surface of the substrate comprise similar reaction parameters.

* * * * *